United States Patent [19]
Paoli

[11] Patent Number: 5,216,263
[45] Date of Patent: Jun. 1, 1993

[54] HIGH DENSITY, INDEPENDENTLY ADDRESSABLE, SURFACE EMITTING SEMICONDUCTOR LASER/LIGHT EMITTING DIODE ARRAYS

[75] Inventor: Thomas L. Paoli, Los Altos, Calif.

[73] Assignee: Xerox Corporation, Stamford, Conn.

[21] Appl. No.: 620,229

[22] Filed: Nov. 29, 1990

[51] Int. Cl.$^5$ .................. H01L 33/00; H01L 29/161; H01L 27/02; H01L 29/06
[52] U.S. Cl. ........................................ 257/88; 257/93; 257/94; 257/95; 372/50
[58] Field of Search ................ 357/16, 17, 47, 55, 357/68; 372/43-46, 50; 350/96; 257/88, 93, 94, 95, 183, 506

[56] References Cited

U.S. PATENT DOCUMENTS

| | | | |
|---|---|---|---|
| 4,870,652 | 9/1989 | Thornton | 372/50 |
| 5,031,187 | 7/1991 | Orenstein et al. | 372/50 |
| 5,073,041 | 12/1991 | Rastani | 385/33 |

FOREIGN PATENT DOCUMENTS 60-76117  9/1985  Japan .

OTHER PUBLICATIONS

Rastani et al., "Arrays of Focused Beams . . . ", Spatial Light Modulators and Applications, 1990 Technical Digest, vol. 14, pp. 76-79, Sep. 10-12, 1990.
Chang-Hasnain et al., "Surface Emitting Laser Arrays with Uniformly Separated Wavelengths", Electronics Letters, vol. 26, No. 13, pp. 940-942, Jun. 21, 1990.
Jewell et al., "Low-Threshold Electrically Pumped Vertical-Cavity Surface-Emitting Microlasers", Electronics Letters, vol. 25, No. 17, pp. 1123-1124, Aug. 17, 1989.
Yablonitch et al., "Double Heterostructure GaAs/AlGaAs Thin Film Diode Lasers on Glass Substrates", IEEE Photonics Technology Letters, vol. 1, No. 2, pp. 41-42, Feb. 1989.
Tell et al., "High-power cw vertical-cavity top surface-emitting GaAs quantum well lasers", Applied Physics Letters, vol. 57, No. 18, pp. 1855-1857, Oct. 29, 1990.

Primary Examiner—Mark V. Prenty
Attorney, Agent, or Firm—William Propp

[57] ABSTRACT

A high density surface emitting semiconductor LED array comprises disordered regions extending through a second confinement layer, an active layer and partially extending through a first confinement layer to define light emitting areas therebetween the disordered regions. Individual contacts on the contact layer aligned with each emitting area inject current through the layers to a contact on a substrate causing emission of light from the active layer through the surface of the exposed first confinement layer in the substrate. The second confinement layer can be replaced with a DBR to form an enhanced LED array. Both confinement layers can be replaced with DBRs to form a laser array. A refractive semiconductor layer, fresnel lenses or a micro lens array can be used to optically modify the surface emitted light.

38 Claims, 5 Drawing Sheets

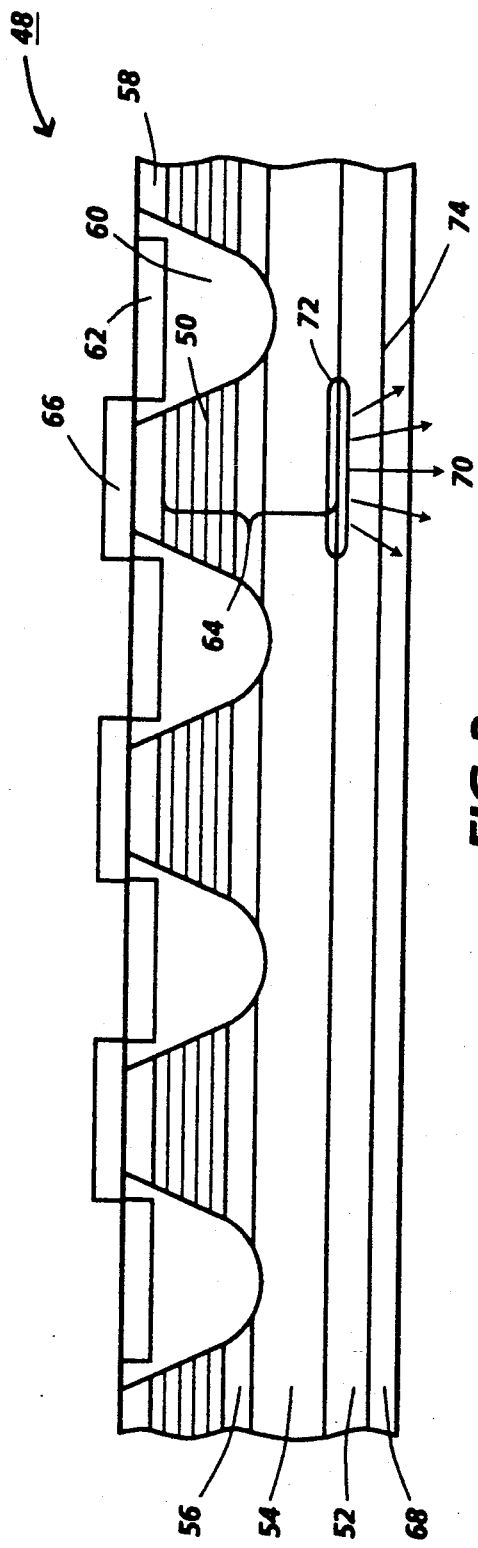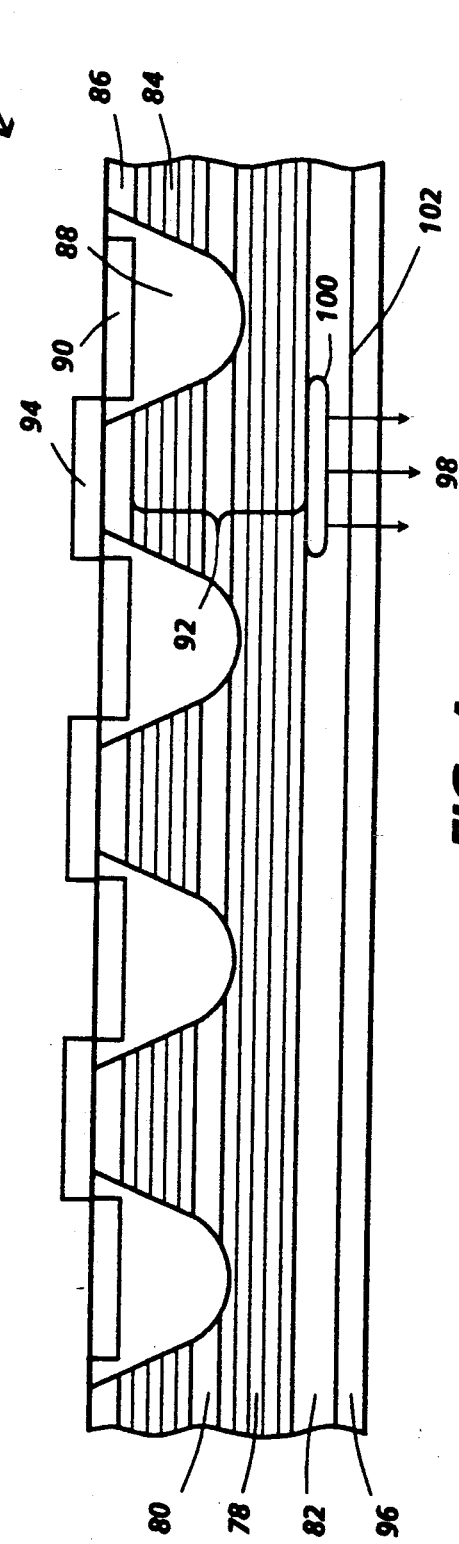

HIGH DENSITY, INDEPENDENTLY ADDRESSABLE, SURFACE EMITTING SEMICONDUCTOR LASER/LIGHT EMITTING DIODE ARRAYS

BACKGROUND OF THE INVENTION

This invention relates to a surface emitting semiconductor laser/light emitting diode structure and, more particularly, to a high density surface emitting semiconductor structure with independently addressable individual light emitting elements.

The ability to fabricate closely spaced, or high density, independently addressable laser and light emitting diode (LED) sources is important for many applications such as optical disk technology, laser printing and scanning, optical interconnection and fiber optic communications.

Individually, semiconductor light emitting diodes and semiconductor lasers are low power output devices. Arrays of semiconductor light emitting diodes or semiconductor lasers can be used to increase the power output and to simplify optical system design. To provide and maintain good optical alignment of the light emitting elements of the array with one another and to minimize the assembly involved, arrays have been fabricated so that the light emitting elements are in a single semiconductor substrate.

One problem with such arrays is maintaining the electrical and optical isolation between the individual light emitting elements. Another problem is increasing the density of the light emitting elements in the substrate by closely spacing the elements together while still maintaining the isolation, avoiding heat dissipation problems, and providing precise alignment of the elements.

Another problem is making each individual light emitting element in the array independently addressable. As the light emitting elements are spaced closer together in higher densities, it is progressively more difficult to separately, individually and independently cause each element to emit light.

Typical laser and LED sources have been edge emitters. The light is emitted from the edge of a monolithic structure of semiconductor layers. An alternative construction is surface emitters where the light is emitted from the surface of the monolithic structure of semiconductor layers.

Surface emitting semiconductor light sources have several advantages over edge emitters. The light emitting surface of a surface emitter is larger than that of an edge emitter. The power needed to cause emission of light is less for a surface emitter than an edge emitter. Surface emitting LEDs are more efficient than edge emitting LEDs because they have that larger emitting area. Fabrication of surface emitting lasers can be less complex than fabrication of edge emitting lasers since the cleaving and mirror passivation needed for edge emitters are eliminated.

If the individual contacts that make the surface emitters of the array independently addressable are on the same side of the semiconductor as the light emitting surface, the lateral spacing between the surface emitting light sources is restricted and consequently the density of the array is limited. The diameter of the contact will be larger than the diameter of the emitting surface. Annular contact shapes are also more difficult to contact while maintaining a clear aperture for the emitting surface. For direct wire bonds the contacts may require an auxiliary pad. Same surface contacts and emitting surfaces also may increase the amount of heat generated and may cause dissipation problems.

The individual contacts that make the surface emitters of the array independently addressable should also be directly aligned with the light emission optical cavity. Alignment is advantageous because it minimizes the electrical resistance, the current spreading to each emitter, and the size of the electrode. It also places the heat-sinking as close to the emitting area as possible. Minimizing current spreading helps electrically isolate the individual elements.

It is an object of this invention, therefore, to provide a high density array of light source surface emitters on a single substrate.

It is a further object of this invention to provide a means for independent addressing of the individual laser or light emitting diode elements in this high density array.

It is yet another object of this invention to provide the independently addressable, individual contacts of the array on the opposite surface of the surface emitting semiconductor light source from the light emission surface.

It is still another object of this invention to provide that the independently addressable, individual contacts of the array are directly aligned with the light emission optical cavities and thereby maximize the density of emitters.

SUMMARY OF THE INVENTION

In accordance with the present invention, a high density surface emitting semiconductor LED array comprises a first confinement layer and a substrate of one conductivity type, an active layer, a second confinement layer and a contact layer of an opposing conductivity type. Disordered regions extend from the contact layer through to the first confinement layer defining light emitting areas therebetween. The light emitting areas can be laterally shaped for optimum use. Individual contacts on the contact layer aligned with each light emitting area inject current through the light emitting area to the contact on the substrate causing emission of light from the active layer in the light emitting area through the surface of the first confinement layer.

The second confinement layer can be replaced with multiple layers making a highly reflective mirror known as a distributed Bragg reflector (DBR) to form an enhanced LED array. Both confinement layers can be replaced with DBRs to form an optical cavity, instead of a light emitting area, and a laser array rather than a LED array. Similarly, either or both DBRs can be replaced with a confinement layer and a high reflectivity coating.

A transparent refractive layer can be deposited between the substrate and the first confinement layer to diverge the emitted light. Alternately the output surface of the first confinement layer, the first DBR or the refractive layer can be etched to form a Fresnel lens for collimating or focussing the laser output. A micro lens array can be positioned adjacent to the surface emitting areas. The semiconductor laser/light emitting diode arrays can also be formed into two-dimensional arrays. The semiconductor laser/light emitting diode arrays can also be fabricated without the substrate.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 3 is a schematic illustration of a side view of an enhanced, high density, independently addressable, surface emitting, semiconductor LED array with a DBR formed according to this invention.

FIG. 4 is a schematic illustration of a side view of a high density, independently addressable, surface emitting, semiconductor laser array formed according to this invention.

DESCRIPTION OF THE PREFERRED EMBODIMENT

Figure 1:
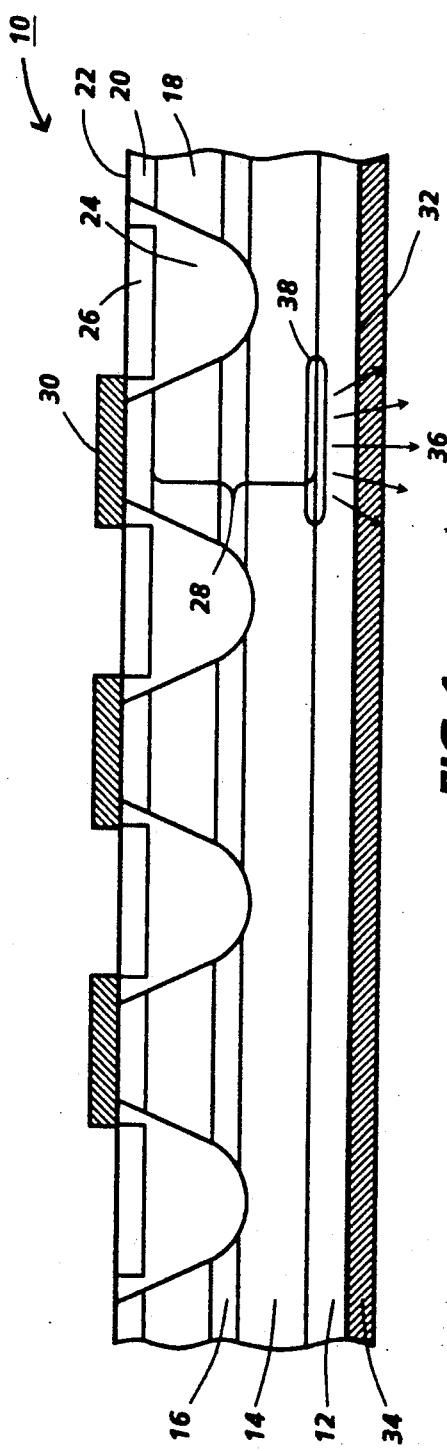
FIG. 1 is a schematic illustration of a side view of a high density, independently addressable, surface emitting, semiconductor LED array formed according to this invention.

Reference is now made to FIG. 1, wherein there is illustrated a high density, independently addressable, surface emitting semiconductor LED array 10 of this invention.

LED array 10 comprises a substrate 12 of n-GaAs upon which is epitaxially deposited a first confinement layer 14 of n-$Al_xGa_{1-x}As$; an active layer 16 of non-doped GaAs for providing light wave generation and propagation, a second confinement layer 18 of p-$Al_yGa_{1-y}As$ where $x=$ or $\neq y$, and a contact layer 20 of p-GaAs. The bandgap of the semiconductor material of the active layer 16 should be less than that of the first confinement layer 14 so that the first confinement layer is transparent to the light generated in the active layer. The first confinement layer should also have a doping level as low as possible without introducing unnecessary resistance so that the first confinement layer is transparent to the light generated in the active layer. The substrate, on the other hand, should be heavily doped to increase electrical conductivity.

Since the first confinement layer 14 and the substrate 12 are both n-type conductivity, that side of the LED array from the active layer is referred to as the n-side of the LED array. Similarly, since the second confinement layer 18 and the contact layer 20 are both p-type conductivity, that side of the LED array from the active layer is referred to as the p-side of the LED array.

The active layer may, in the alternative, be nondoped or p-type doped or n-type doped; GaAs, $Al_zGa_{1-z}As$ or $(Al_zGa_{1-z})_{0.5}In_{0.5}P$; or a relatively thin conventional double heterostructure (DH) active layer; or a single quantum well, such as GaAs or $Al_zGa_{1-z}As$ where z is very small and $z<x$ and y; or a multiple quantum well superlattice, such as alternating layers of GaAs and $Al_zGa_{1-z}As$ where $z<x$ and y or alternating layers of $Al_wGa_{1-w}As$ and $Al_BGa_{1-B}As$ where $w<B<x$ or y (w for well and B for barrier). Also, in the alternative, any of the aforementioned active layers can be deposited between two semiconductor confinement layers of $Al_mGa_{1-m}As$ and $Al_nGa_{1-n}As$, where m may or may not equal n, but with bandgaps intermediate between the bandgaps of the active layer and the first and second confinement layers, in a separate confinement structure.

As is known in the art, the epitaxial growth of LED array 10 may be carried out by molecular beam epitaxy (MBE) or metalorganic chemical vapor deposition (MOCVD). The substrate 12 may be about 100 microns thick. Confinement layers 14 and 18 may have a thickness in the range of 0.1 to 1 micron. Active layer 16 may be a thin conventional layer having a thickness of 50 nanometers to 2 microns or may be comprised of a superlattice structure of quantum wells which may be 3 to 50 nanometers thick. The contact layer is typically 0.1 to 0.2 microns thick.

There are alternate conventional techniques and diffusion/implant species for carrying out the desired disordering or the elemental implant/annealing technique. Discussion hereafter will be confined to impurity induced disordering. However, it should be noted that these other techniques and elemental diffusions or implants are equally applicable.

Upon completion of the epitaxial growth, a $Si_3N_4$ mask is formed on the top surface 22 of the contact layer 20 with openings exposing regions of the semiconductor structure to impurity induced disordering. The mask protects the unexposed regions which will form and shape the LED light emitting areas which can be circular, elliptical, square, parallelogramal, trapezoidal, triangular or any desired shape or size.

The light emitting areas are established by first selectively diffusing a high concentration n-impurity dopant, such as silicon, into the regions of the semiconductor structure exposed through the mask. Other n-impurity dopant elements would include Ge and Sn.

A silicon layer is deposited in the opening in the $Si_3N_4$ mask and then capped with an additional layer of $Si_3N_4$. The diffusion of silicon is accomplished at a temperature of approximately 800° C. and is maintained for a sufficiently long period of time, e.g. seven to eight hours, to penetrate the contact layer 20, the second confinement layer 18 and the active layer 16, and partially penetrate the first confinement layer 14.

The diffusion of silicon through and into the active layer 16, the contact layer 20 and the confinement layers 14 and 18 causes an intermixing of Ga and Al in the active layer 16, the contact layer 20 and the confinement layers 14 and 18, thereby forming a n-impurity induced disordered region 24.

Upon completion of the impurity induced disordering steps, electrically insulating regions 26 are formed in the disordered regions 24 by proton implantation through the top surface 22 to provide a level of electrical isolation of the LED light emitting areas which allows independent addressability of each individual light emitting area.

Between the disordered regions 24 in the semiconductor LED array are the LED light emitting areas 28 consisting of the nondisordered sections of the second confinement layer 18, the active layer 16 and the first confinement layer 14. The disordered regions, optically and electrically, isolate and separate the light emitting areas. The light emitting areas are shaped by the confinement layers in the vertical direction and the shape of the disordered regions in the horizontal direction.

Standard chemical etching means or other techniques are employed to form metal contacts 30 of Cr-Au or Ti-Pt-Au on the top surface 22 of the nondisordered contact layer 20 aligned with each optical cavity 28. Each contact 30 separately, independently, and individually contacts an optical cavity. The contacts 30 are referred to as p-contacts since they are on the p-side of the LED array.

The contacts are typically circular or annular in shape for ease in forming high density arrays, although the contacts may also be elliptical, half-moon or other shapes. The individual contact can be equal in size or smaller than the active layer in the aligned light emitter area and can be shaped to match the active layer or the light emitter area. The contact is shaped by shaping the hole in a metallization mask.

The shape of the contact is important so that the contact has the largest area possible for minimizing electrical resistance without limiting the density of the emitters and to match the bonding pad for effective heatsinking. The nondisordered contact layer 20 beneath each contact 30 provides low contact resistance to the other semiconductor layers and minimizes the contact heating.

The bottom surface 32 of the substrate 12 is also metallized with Au/Ge to form a substrate contact 34. The substrate contact is referenced to ground and referred to as the n-contact since it is on the n-side of the LED array.

Current is injected between the p-contact 30 and the n-contact 34 to forward-bias the p-n junction of p-confinement layer 18 and n-confinement layer 14 to cause the active layer 16 to emit light 36 from the light emitting area 28. The current is injected substantially parallel to the LED light emitting area, through the p-contact 30, the p-contact layer 20, the p-confinement layer 18, the active layer 16 of the individual light emitting area, and then spreads in the n-confinement layer 14 into the substrate 12 and out the n-contact 34.

The ground or n-contact is common to all the light emitting areas. However, each light emitting area or LED element contains a p-n junction that is separately biased through its p-contact from all the others. Since each p-contact is positively biased with respect to ground, current flows only from each p-contact to ground. The electrically isolating regions and the disordered regions prevents any single p-contact from causing adjacent light emitting areas to emit light. Flow between different p-contacts does not occur because any small potential difference between the addressed p-contact and a neighboring p-contact corresponds to a reverse voltage on the neighboring p-contact.

The light 36 is emitted through the emitter surface area 38, substantially perpendicular to the bottom surface 32 of the substrate 12 and aligned with the p-contact 30 and the LED light emitting area 28, hence LED array 10 is a surface emitting LED. The p-contact 30, aligned with the light emitting area 28 prevents light from being emitted by the light emitting area through the p-side of the LED array.

The shape of the emitter surface area and the resulting emitted light is determined by the shape of the LED light emitting areas which can be circular, elliptical, square, parallelogramal, trapezoidal, triangular or any desired shape or size. The emitted light itself can be either continuous wave or pulse.

Typically, the LED array 10 has an operating current of about 10 milliamperes with an output power of about 30 microwatts per individual light emitting element.

Figure 2:
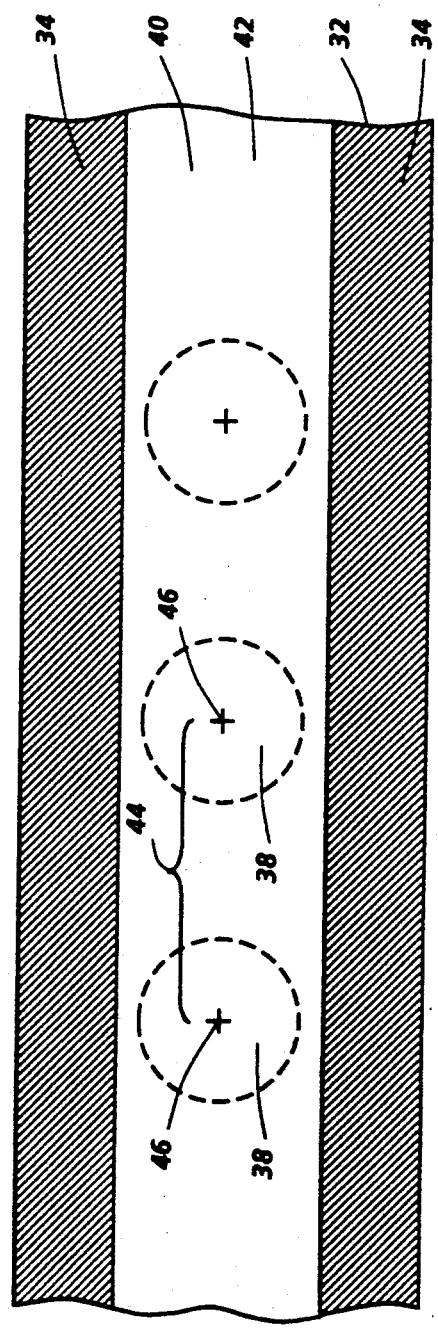
FIG. 2 is a schematic illustration of the bottom view of the LED array of FIG. 1.

FIG. 2 is the bottom view of the LED array 10 of FIG. 1, showing the bottom surface 32 of the substrate with the stripe n-contacts 34 and the array of circular emitter surface areas 38 of the LED light emitting areas where the light is emitted through the surface between the n-contacts.

The thickness of the substrate 12 may impede emission of the light from the active layer of the LED array. To avoid this impediment, the active layer can be made of semiconductor material with a bandgap less than the bandgap of the substrate. Alternatively, the substrate can be removed. Prior to the formation of the n-contacts, a trough 40 or stripe is etched in the surface 32 of the substrate 12, by standard chemical etching means or other techniques, to expose the surface 42 of the first confinement layer 14 to expose the emitter surface areas 38 of the LED optical cavities 28 therebeneath to facilitate light emission. The exposed surface of the first confinement layer may also be coated with an antireflective coating to also facilitate light emission. The processing of the LED array 10 is done from both the p-side and the n-side of the LED array.

The active layer is shallower in the LED array and closer to the light emitting surface. Similarly, the light emitted from the active layer does not pass through a heavily doped contact layer unlike when the individual contacts and the light emitting surface areas are on the same side of the light emitting semiconductor.

The diameters of the emitter surface areas 38 are typically 2 microns or less. The spacing 44 from the center 46 of one individual LED element to the center 46 of the next LED element as measured from the emitter surface areas 38 is 3 microns or less which provides for a high density of LEDs in the array. The impurity induced disordering provides accurate and closer center to center spacing of the individual LED elements.

Since the individually addressable contacts, the p-contacts, are not on the same surface as the light emitting areas, the lateral spacing of the light emitting elements is slightly closer. Also, the light emitter geometry can be staggered or offset if the p-contacts and the light emitter areas are also staggered, rather than the straight line of p-contacts and LED emitter surface areas shown in the Figure. A staggered or offset geometry, of course, provides a higher density of LED elements.

In FIG. 3, enhanced LED array 48 is of identical structure to the LED array 10 of FIG. 1, except that the p-confinement layer 18 of FIG. 1 has been replaced by a distributed Bragg reflector (DBR) 50 in FIG. 3. Thus, the LED array 48 comprises a substrate 52 of n-GaAs upon which is epitaxially deposited a confinement layer 54 of n-$Al_xGa_{1-x}As$; an active layer 56 of nondoped GaAs for providing light wave generation and propagation, a p-DBR 50 of alternating layers of p-$Al_yGa_{1-y}As$ and p-$Al_zGa_{1-z}As$ where $z \neq y$, and a contact layer 58 of p-GaAs.

N-impurity induced disordered regions 60 are formed in the enhanced LED array 48 extending through portions of the contact layer 58, the p-DBR 50, the active layer 56 and the n-confinement layer 54. Electrical isolating regions 62 are formed on the top surface of the disordered regions.

Between the disordered regions 60 in the enhanced LED array 48 are the enhanced LED light emitting areas 64 consisting of the nondisordered sections of the p-DBR 50, the active layer 56 and the n-confinement layer 54. The p-DBR is constructed to have a reflectivity as close to one as possible.

P-contacts 66 are formed on the p-contact layer 58, aligned with each enhanced LED light emitting area 64 and a n-contact 68 is formed on the substrate 52, except in a trough formed in the substrate not shown.

The light 70 is emitted through the emitter surface area 72 on the bottom surface of the n-confinement layer, substantially perpendicular to the bottom surface 74 of the substrate 52. The p-DBR reflects the light being emitted by the optical cavity toward the p-side of the LED array back through the surface area on the n-side of the LED array, thus enhancing the amount of light emission of the LED array. The exposed surface of the confinement layer and the emitter surface area in the trough may also be coated with an anti-reflective coating to also facilitate light emission.

Typically, the enhanced LED array 48 has an operating current of about 10 milliamperes with an output power of about 60 microwatts.

Alternatively, the active layer 56 can be in a separate confinement structure to keep the carriers away from the DBR. Also alternatively, the p-confinement layer 18 of FIG. 1 may be coated with a highly reflective metal which serves as an electrically conductive, optical reflector to form an enhanced LED array.

In FIG. 4, laser array 76 is of identical structure to the enhanced LED array 48 of FIG. 3, except that the n-confinement layer 54 of FIG. 3 has been replaced by a DBR 78 in FIG. 4 and that active layer 56 of FIG. 3 which provides lightwave generation and propagation has been replaced by active layer 80 in FIG. 4 which provides lightwave generation and propagation under lasing conditions. Thus the laser array 76 comprises a substrate 82 of n-GaAs upon which is epitaxially deposited a n-DBR 78 of alternating layers of n-$Al_xGa_{1-y}As$ and n-$Al_yGa_{1-y}As$ where $x \neq y$, an active layer 80 of nondoped GaAs for providing light wave generation and propagation under lasing conditions, a p-DBR 84 of alternating layers of p-$Al_AGa_{1-A}As$ and p-$Al_BGa_{1-B}As$ where $A \neq B$, and a contact layer 86 of p-GaAs.

N-impurity induced disordered regions 88 are formed in the laser array 76 extending through portions of the contact layer 86, the p-DBR 84, the active layer 80 and the n-DBR 78. Electrical isolating regions 90 are formed on the top surface of the disordered regions.

Between the disordered regions 88 in the laser array 76 are the laser optical cavity regions 92 consisting of the nondisordered sections of the p-DBR 84, the active layer 80 and the n-DBR 78. The p-DBR is constructed to have a reflectivity as close to one as possible while the n-DBR is constructed with a reflectivity close to one but less than that of the p-DBR.

P-contacts 94 are formed on the p-DBR 84, aligned with each laser optical cavity regions 92 and a n-contact 96 is formed on the substrate 82 except in a trough formed in the substrate not shown.

The light 98 is emitted through the emitter surface area 100 on the bottom surface of the n-DBR in the trough (not shown) in the substrate, substantially perpendicular to the bottom surface 102 of the substrate 82. An anti-reflective coating is not required to coat the trough. Since the light is from a laser optical cavity, it is, of course, coherent and can be either continuous wave or pulse.

Typically, the laser array 76 has a threshold current of 1 to 5 milliamperes and an operating current of about 10 milliamperes with an output power of about 1 to 3 milliwatts. Threshold currents of less than 1 milliampere are also possible for the laser array.

Alternatively, the active layer 80 can be in a separate confinement structure to keep the carriers away from the DBR. Also alternatively, the p-confinement layer 18 of FIG. 1, which was replaced by a distributed Bragg reflector (DBR) 84 in FIG. 4, may be coated with a highly reflective metal which serves as an electrically conductive, optical reflector to form a laser array.

Figure 5:
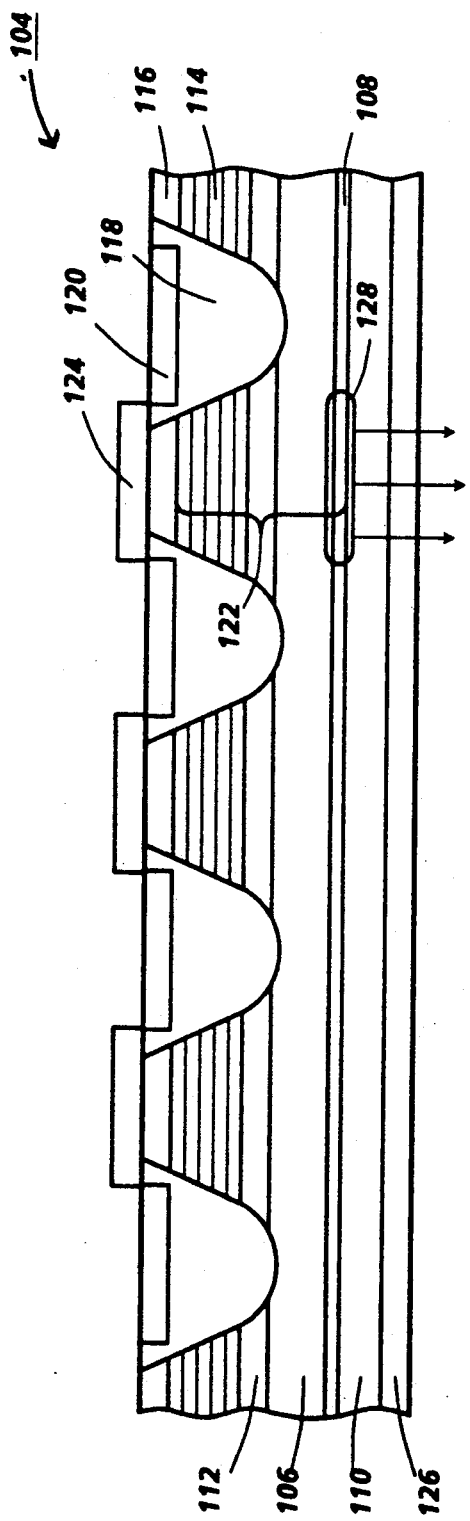
FIG. 5 is a schematic illustration of a side view of an alternate embodiment of the high density, independently addressable, surface emitting, semiconductor laser array formed according to this invention.

In FIG. 5, the laser array 104 is of identical structure to the laser array 76 of FIG. 4, except that the n-DBR 78 of FIG. 4 has been replaced with a n-confinement layer 106 and a high reflectivity coating 108 in FIG. 5. Thus the laser array 104 comprises a substrate 110 of n-GaAs, a n-confinement layer 106 of n-$Al_xGa_{1-x}As$, an active layer 112 of nondoped GaAs, a p-DBR 114 of alternating layers of p-$Al_yGa_{1-y}As$ and p-$Al_zGa_{1-z}As$ where $z \neq y$, a contact layer 116, n-impurity induced disordered regions 118, electrical isolating regions 120, laser optical cavity 122, p-contacts 124, and stripe n-contact 126 formed on the substrate 110 along with a trough in the substrate not shown.

After the trough is etched in the substrate, the high reflectivity coating 108 is deposited by evaporation on the exposed surface of the n-confinement layer 106. The coating covers the surface emitters areas 128 and forms one end of the laser optical cavity 122. The high reflectivity coating is typically a multilayer stack of materials such as silicon and aluminum oxide as is known in the art.

Alternatively, the active layer 112 can be in a separate confinement structure to keep the carriers away from the DBR. The p-confinement layer 18 of FIG. 1 which was replaced by a distributed Bragg reflector (DBR) 114 in FIG. 5, may instead be coated with a highly reflective metal to serve as an electrically conductive optical reflector.

Figure 6:
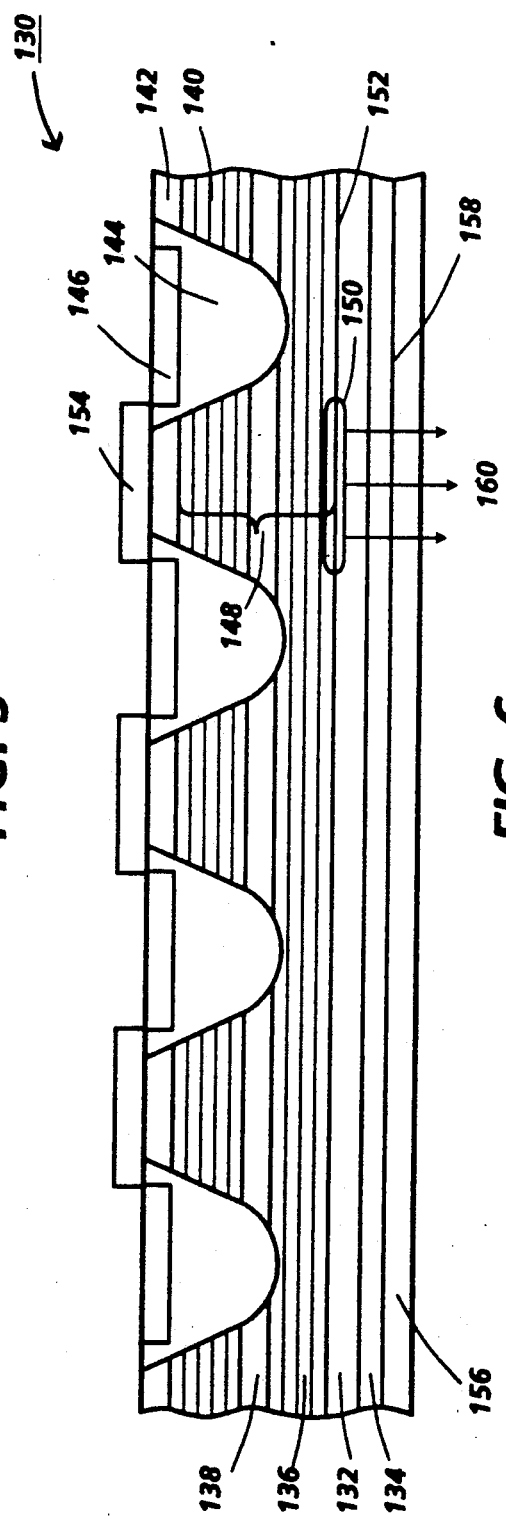
FIG. 6 is a schematic illustration of a side view of an alternate embodiment of the high density, independently addressable, surface emitting, semiconductor laser array with overlapping light emission formed according to this invention.

In FIG. 6, the laser array 130 is of identical structure to the laser array 72 of FIG. 4, except that a refractive layer 132 is deposited between the substrate 134 and the n-DBR 136. Thus, the laser array 130 comprises a substrate 134 of n-GaAs upon which is deposited a refractive layer 132 of $Al_yGa_{1-y}As$, a n-DBR 136 of alternating layers of n-$Al_xGa_{1-x}As$ and n-$Al_yGa_{1-y}As$ where $x \neq y$, an active layer 138 of nondoped GaAs, a p-DBR 140 of alternating layers of p-$Al_xGa_{1-x}As$ and p-

$Al_yGa_{1-y}As$ where $x \neq y$, and a contact layer 142 of p-GaAs. The laser array further comprises n-impurity induced disordered regions 144 and electrical isolating regions 146.

The laser optical cavity 148 consists of the nondisordered sections of the p-DBR 140, active layer 138 and n-DBR 136. The emitter surface areas 150 are the interface surface 152 between the n-DBR 136 and the refractive layer 132. P-contacts 154 are formed on the p-DBR 140 and a stripe n-contact 156 is formed on the substrate 134. A trough, not shown, is etched in the substrate 134 to expose the surface 158 of the refractive layer 132.

The refractive layer is transparent to light emitted from the laser optical cavity through the emitter surface areas but the refractive layer does diverge the light 160 emitted from the laser array increasing the output spot size. The refractive layer should be thick enough to give the appropriate expansion of the spot size. A 5 to 10 micron thick refractive layer, for example, should double the size of the spot.

Increasing the thickness of the refractive layer 132 increases the refractive power, diverger the angle of the emitted light further and increases the output spot size. Selection of an appropriate thickness for the refractive layer will result in partially overlapping output spots of emitted light between the adjacent laser optical cavities of the adjacent laser elements. Fabricating the surface emitter area in an elliptical shape, for example, will further facilitate overlapping the diverging emitted light in the short axis direction of the ellipse. Overlapping in the long axis direction is pertinent to printing where controlled overlap from line to line may be desirable.

One advantage to the refractive layer is that no phase coherence is introduced between adjacent laser emitters. Consequently, the overlapping beams can be used optically without any optical interference effects.

Although the light emitted from the LED array and the enhanced LED array is not coherent, the refractive layer of AlGaAs can still be used to diverge the light emitted from the array, although it would not be as effective as with light emitted from a laser since the radiation pattern from a LED is lambertian.

Figure 7:
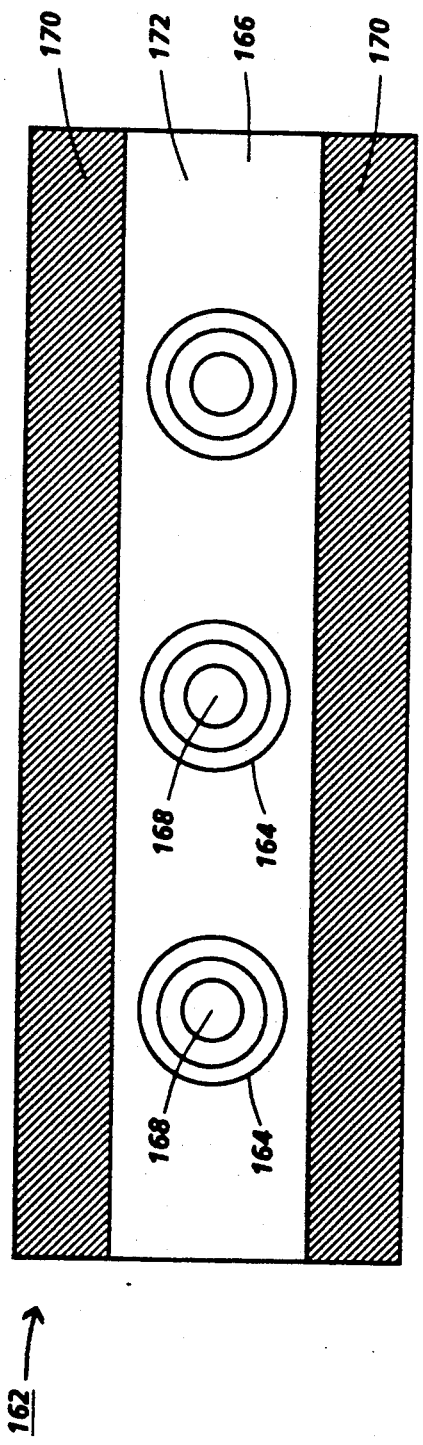
FIG. 7 is a schematic illustration of a bottom view of an alternate embodiment of the high density, independently addressable, surface emitting, semiconductor laser or LED array with individual Fresnel lenses formed according to this invention.

As shown in FIG. 7, a laser array 162 is fabricated in the identical fashion to laser array 76 of FIG. 4 except that fresnel lenses 164 are formed on the exposed n-DBR 166 over the emitter surface areas 168. Thus, the laser array 162 has stripe n-contacts 170 alternating with troughs 172 of the exposed surfaces 166 of the n-DBR with its emitter surface areas 168. A fresnel lens 164 is formed for each individual laser element by etching by ion milling or reactive ion etching or other means as is known in the art. Each lens can be shaped to magnify the spot size of the emitted light, change the direction of the emitted light or otherwise alter the emitted light optically. The lateral shape of the lens can be formed to match the transverse shape of the optical cavity.

Again, although the light emitted from the LED array and the enhanced LED array is not coherent, the fresnel lenses can still be used to collimate, diverge, focus or otherwise modify the light emitted from the array by forming the lenses in the n-confinement layer over the emitter surface areas, although it would not be as effective as with light emitted from a laser since the radiation pattern from a LED is lambertian. Fresnel lenses can also be formed in the refractive layer of FIG. 6 over the emitter surface areas.

Figure 8:
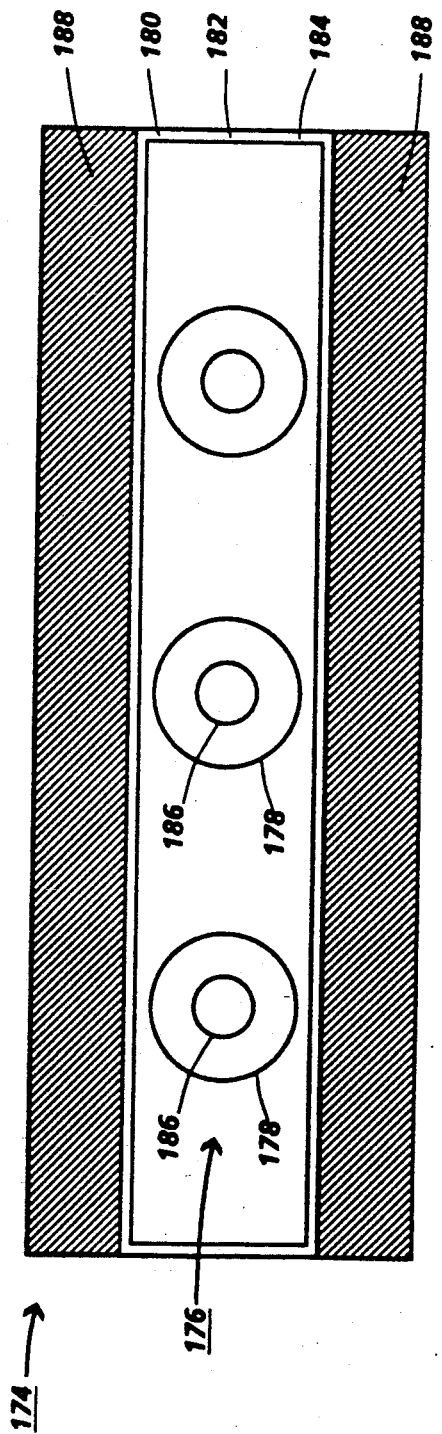
FIG. 8 is a schematic illustration of a bottom view of an alternate embodiment of the high density, independently addressable, surface emitting, semiconductor laser or LED array with a micro lens array formed according to this invention.

As shown in FIG. 8, a laser array 174 is fabricated in the identical fashion to laser array 76 of FIG. 4 except that an array 176 of micro lens 178 are positioned flush in the trough 180 of the exposed surface 182 of the n-DBR 184. Each micro lens 178 is aligned with an emitter surface area 186. The laser array 174 has stripe n-contacts 188 alternating with the troughs 180 and the micro lens array 176 positioned within the trough.

Each micro lens 178 in the array is formed for each individual laser element by means as is known in the art. Each micro lens can be shaped to magnify the spot size of the emitted light, change the direction of the emitted light or otherwise modify the emitted light optically. The lateral shape of the micro lens can be formed to match the transverse shape of the optical cavity.

Alternatively, the micro lens array can be positioned adjacent to the emitter surface areas of the LED array to magnify the size and spacing of the light emitting areas. By way of illustration, a 3 micron spaced array over a 3 centimeter distance with an optical magnification of 7 will result in 1200 spots per inch over a page-width of 8.5 inches. Similarly, a 4.5 micron spacing of an array will yield 800 spots per inch for a pagewidth.

Again, although the light emitted from the LED array and the enhanced LED array is not coherent, the micro lens array can still be used to collimate, diverge, focus or otherwise modify the light emitted from the LED or enhanced LED array by positioning the micro lens array over the emitter surface areas. However the micro lens array would not be as effective as with light emitted from a laser since the radiation pattern from a LED is lambertian. A micro lens array can also be used with the refractive layer if FIG. 6 over the emitter surface areas.

The driver circuitry for the p-contacts and the necessary bonding pads can be fabricated on a silicon chip, not shown, placed flush against the top surface of the LED or laser array. The silicon chip need not be optically transparent since the light emission will be from the other surface of the LED or laser array. Alternatively, electronic driver circuitry can be fabricated on the semiconductor LED or laser array or separate and adjacent to the array or on or in the substrate of the semiconductor array. Since the p-contact is directly below the active region and the light is emitted from the surface of the n-side of the array, the full cross-sectional area of the array is used for heat dissipation.

Figure 9:
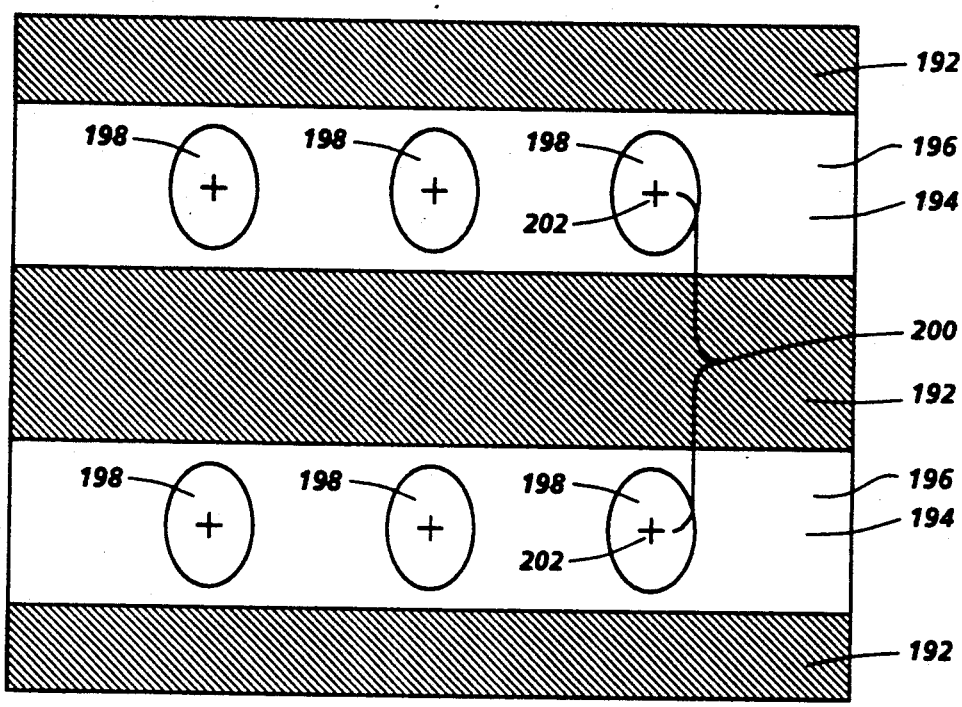
FIG. 9 is a schematic illustration of a bottom view of an alternate embodiment of a two-dimensional, high density, independently addressable, surface emitting, semiconductor laser array formed according to this invention.

In FIG. 9, a two-dimensional array 190 is fabricated in the identical fashion to laser array 76 of FIG. 4 except that linear arrays of FIG. 4 are formed adjacent to each other. Thus, the two-dimensional array 190 has stripe n-contacts 192 alternating with troughs 194 of the exposed surfaces 196 of n-DBRs with its elliptical emitter surface areas 198. The spacing 200 between the center 202 of one individual laser element in one linear array row to the center 202 of one corresponding individual laser element in the next linear array row as measured from the emitter surface areas 198 is typically 9 to 18 microns which provides for a high density of laser elements in the two-dimensional array.

Two-dimensional arrays of surface emitters can be used to simultaneously expose several lines or sequential interlacing of the printed lines. In combination with a refractive layer, two-dimensional arrays can provide optimum overlap of scanning lines. The two-dimensional array is also not restricted to linear rows and columns of surface emitters but the surface emitter layout can be staggered or offset.

The two-dimensional laser array is by way of illustration. The LED and enhanced LED arrays can also be fabricated into a two-dimensional array. Refractive layers, fresnel lens and micro lens arrays, as previously, discussed can also be used with a two-dimensional array.

The prior embodiments of the laser/light emitting diode array of this invention have all been fabricated with a substrate which, to facilitate light emission, has a trough etched in the substrate to the confinement layer or DBR therebeneath to expose the surface emitters. Alternatively, the laser/light emitting diode arrays of this invention can be fabricated without the substrate and resulting etched trough through the epitaxial liftoff method as described by Yablonitch et al., ("*Double Heterostructure GaAs/AlGaAs Thin Film Diode Lasers on GLass Substrates*", IEEE Photonics Technology Letters, Vol. 1, No. 2, pp. 41–42, Feb. 1989).

Figure 10:
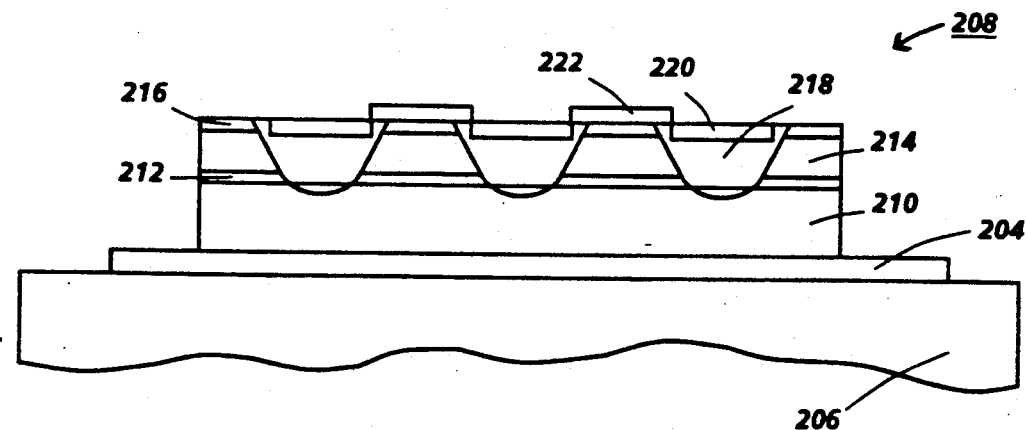
FIG. 10 is a schematic illustration of a side view of an alternate embodiment of a high density, independently addressable, surface emitting, semiconductor LED array without a substrate formed according to this invention.

The epitaxial liftoff method as shown in FIG. 10 provides for a selective release layer 204 of n-AlAs to be deposited on a substrate 206 of GaAs. The release layer is approximately 500 angstroms thick.

A LED array 208 is then fabricated on the selective release layer 204. A first confinement layer 210 of n-$Al_xGa_{1-x}As$ is epitaxially deposited on the release layer, followed by the deposition of an active layer 212 of nondoped GaAs for providing light wave generation and propagation, a second confinement layer 214 of p-$Al_yGa_{1-y}As$ where x may or may not equal y, and a contact layer 216 of p-GaAs. N-disordered regions 218, electrically insulating regions 220 and p-contacts 222 are formed on the LED array 208 as taught previously in this application with regard to the LED array 10 of FIG. 1.

The release layer 204 is then removed by dilute hydrofluoric acid allowing the LED array 208 to be removed from the substrate 206. The LED or laser array is then attached to or made part of the necessary driver circuits as discussed previously in the application. Alternatively, the array can be attached to a patterned carrier that enables separately addressing each element. The stripe n-contact, not shown, of Cr-Au or Ti-Pt-Au is then formed by metallization on the surface of the first confinement layer 210. Since there is no substrate, there is no need for a trough to expose the surface emitter on the surface of the confinement layer. The surface emitter is already exposed between the n-contacts.

The LED array 208 was fabricated by the epitaxial liftoff method by way of illustration. The enhanced LED and laser arrays can also be fabricated by the same method without the semiconductor element of a substrate and the resulting trough etched in the substrate to the confinement layer or DBR therebeneath.

As previously taught in the text accompanying FIG. 6, a refractive layer can be epitaxially deposited on the selective release layer, followed by a first confinement layer or a distributed Bragg reflector. Also as previously taught in the text accompanying FIG. 7, fresnel lenses can be fabricated over the surface emitting areas, once the LED or laser array has been removed from the substrate by the epitaxial liftoff method. As previously taught in the text accompanying FIG. 8, a micro lens array can be positioned flush with the surface emitting areas or positioned adjacent to the surface emitting areas, once the LED or laser array has been removed from the substrate by the epitaxial liftoff method. Also as previously taught in the text accompanying FIG. 9, a two-dimensional array of LED/laser elements can be fabricated by the same method as taught in FIG. 10, without the semiconductor element of a substrate and the resulting trough etched in the substrate to the confinement layer or DBR therebeneath.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A high density, surface emitting, semiconductor light emitting diode (LED) array comprising:
    a first semiconductor confinement layer deposited on a substrate, said first confinement layer and said substrate having the same conductivity type,
    an active semiconductor layer deposited on said first confinement layer, said active layer providing lightwave generation and propagation, said active layer having a smaller bandgap than said first confinement layer,
    a second semiconductor confinement layer deposited on said active layer, said second confinement layer having a conductivity type opposite that of said first confinement layer and said substrate,
    a semiconductor contact layer deposited on said second semiconductor confinement layer, said contact layer and said second confinement layer having the same conductivity type,
    disordered regions extending through said contact layer, said second confinement layer, said active layer and at least partially through said first confinement layer, said disordered regions having a conductivity type opposite that of said contact layer and said second confinement layer,
    at least one trough formed in said substrate exposing a surface of said first confinement layer,
    at least one contact formed on said substrate, said at least one contact not formed in said trough, and
    light emitting areas formed between said disordered regions, contacts formed on said contact layer, one of said contacts formed on said contact layer aligned with each of said light emitting areas such that current injected between one of said contacts on said contact layer and said at least one contact on said substrate will cause light emission from one of said light emitting areas through the exposed surface of said first confinement layer in said trough in said substrate.

2. The high density, surface emitting, semiconductor light emitting diode (LED) array of claim 1 wherein said substrate, said first confinement layer and said disordered regions have n-type conductivity and said second confinement layer and said contact layer have p-type conductivity.

3. The high density, surface emitting, semiconductor light emitting diode (LED) array of claim 1 wherein said light emitting areas comprise the nondisordered portions of the second confinement layer, the nondisordered portions of the active layer and the nondisordered portions of the first confinement layer between adjacent said disordered regions.

4. The high density, surface emitting, semiconductor light emitting diode (LED) array of claim 1 wherein an electrically insulating region is formed on each of said disordered regions.

5. The high density, surface emitting, semiconductor light emitting diode (LED) array of claim 1 further comprising
a refractive semiconductor layer deposited on said substrate,
said first semiconductor confinement layer deposited on said refractive layer,
said at least one trough formed in said substrate exposing a surface of said refractive layer, and said light emission from one of said light emitting areas passes through the surface of said refractive layer in said trough in said substrate.

6. The high density, surface emitting, semiconductor light emitting diode (LED) array of claim 1 further comprising
a third semiconductor confinement layer deposited on said first confinement layer,
said active layer deposited on said third semiconductor confinement layer,
a fourth semiconductor confinement layer deposited on said active layer, and
said second semiconductor confinement layer deposited on said fourth semiconductor confinement layer, wherein said third and fourth confinement layers have bandgaps intermediate between the bandgaps of said active layer and said first and second confinement layers.

7. The high density, surface emitting, semiconductor light emitting diode (LED) array of claim 1 further comprising
an anti-reflective coating on said exposed surface of said first confinement layer in said at least one trough in said substrate.

8. The high density, surface emitting, semiconductor light emitting diode (LED) array of claim 1 further comprising
fresnel lenses etched over said light emitting areas on said exposed surface of said first confinement layer in said trough in said substrate.

9. The high density, surface emitting, semiconductor light emitting diode (LED) array of claim 1 further comprising
a micro lens array positioned over said light emitting areas on said exposed surface of said first confinement layer in said trough in said substrate.

10. The high density, surface emitting, semiconductor light emitting diode (LED) array of claim 1 wherein said light emitting areas form a two-dimensional array.

11. A high density, surface emitting, semiconductor light emitting diode (LED) array comprising:
a first semiconductor confinement layer deposited on a substrate, said first confinement layer and said substrate having the same conductivity type,
an active semiconductor layer deposited on said first confinement layer, said active layer providing lightwave generation and propagation, said active layer having a smaller bandgap than said first confinement layer,
alternating semiconductor layers deposited on said active layer, said alternating layers forming a distributed Bragg reflector (DBR), said DBR having a conductivity type opposite that of said first confinement layer and substrate,
a semiconductor contact layer deposited on said DBR, said contact layer and said DBR having the same conductivity type,
disordered regions extending through said contact layer, said DBR, said active layer and at least partially through said first confinement layer, said disordered regions having a conductivity type opposite that of said contact layer and said DBR,
at least one trough formed in said substrate exposing a surface of said first confinement layer,
at least one contact formed on said substrate, said at least one contact not formed in said trough, and
light emitting areas formed between said disordered regions, contacts formed on said contact layer, one of said contacts formed on said contact layer aligned with each of said light emitting areas such that current injected between one of said contacts on said contact layer and said at least one contact on said substrate will cause light emission from one of said light emitting areas through the exposed surface of said first confinement layer in said trough in said substrate.

12. The high density, surface emitting, semiconductor light emitting diode (LED) array of claim 11 wherein said substrate, said first confinement layer and said disordered regions have n-type conductivity and said DBR and said contact layer have p-type conductivity.

13. The high density, surface emitting, semiconductor light emitting diode (LED) array of claim 11 wherein said light emitting areas comprise the nondisordered portions of the DBR, the nondisordered portions of the active layer and the nondisordered portions of the first confinement layer between adjacent said disordered regions.

14. The high density, surface emitting, semiconductor light emitting diode (LED) array of claim 11 wherein an electrically insulating region is formed on each of said disordered regions.

15. The high density, surface emitting, semiconductor light emitting diode (LED) array of claim 11 further comprising
a refractive semiconductor layer deposited on said substrate,
said first semiconductor confinement layer deposited on said refractive layer,
said at least one trough formed in said substrate exposing a surface of said refractive layer, and said light emission from one of said light emitting areas passes through the surface of said refractive layer in said trough in said substrate.

16. The high density, surface emitting, semiconductor light emitting diode (LED) array of claim 11 further comprising
a second semiconductor confinement layer deposited on said first confinement layer which was deposited on said substrate,
said active layer deposited on said second semiconductor confinement layer,
a third semiconductor confinement layer deposited on said active layer, and
said DBR deposited on said third semiconductor confinement layer, wherein said second and third confinement layers have bandgaps intermediate between the bandgaps of said active layer, and said first confinement layer and said DBR.

17. The high density, surface emitting, semiconductor light emitting diode (LED) array of claim 11 further comprising
an anti-reflective coating on said exposed surface of said confinement layer in said at least one trough in said substrate.

18. The high density, surface emitting, semiconductor light emitting diode (LED) array of claim 11 further comprising
fresnel lenses etched over said light emitting areas on said exposed surface of said first confinement layer in said trough in said substrate.

19. The high density, surface emitting, semiconductor light emitting diode (LED) array of claim 11 further comprising
a micro lens array positioned over said light emitting areas on said exposed surface of said first confinement layer in said trough in said substrate.

20. The high density, surface emitting, semiconductor light emitting diode (LED) array of claim 11 wherein said light emitting areas form a two-dimensional array.

21. A high density, surface emitting, semiconductor laser array comprising:
alternating semiconductor layers deposited on a substrate, said alternating layers forming a first distributed Bragg reflector (DBR), said first DBR and said substrate having the same conductivity type,
an active semiconductor layer deposited on said first DBR, said active layer providing lightwave generation and propagation under lasing conditions, said active layer having a smaller bandgap than said first DBR,
alternating semiconductor layers deposited on said active layer, said alternating layers forming a second distributed Bragg reflector (DBR), said second DBR having a conductivity type opposite that of said first DBR and said substrate,
a semiconductor contact layer deposited on said second DBR, said contact layer and said second DBR having the same conductivity type,
disordered regions extending through said contact layer, said second DBR, said active layer and at least partially through said first DBR, said disordered regions having a conductivity type opposite that of said contact layer and said second DBR,
at least one trough formed in said substrate exposing a surface of said first DBR,
at least one contact formed on said substrate, said at least one contact not formed in said trough, and
optical cavities formed between said disordered regions, contacts formed on said contact layer, one of said contacts formed on said contact layer aligned with each of said optical cavities such that current injected between one of said contacts on said contact layer and said at least one contact on said substrate will cause light emission from one of said optical cavities through the exposed surface of said first DBR in said trough in said substrate.

22. The high density, surface emitting, semiconductor laser array of claim 21 wherein said substrate, said first DBR and said disordered regions have n-type conductivity and said second DBR and said contact layer have p-type conductivity.

23. The high density, surface emitting, semiconductor laser array of claim 21 wherein said optical cavities comprises the nondisordered portions of the second DBR, the nondisordered portions os the active layer and the nondisordered portions of the first DBR between adjacent said disordered regions.

24. The high density, surface emitting, semiconductor laser array of claim 21 wherein an electrically insulating region is formed on each of said disordered regions.

25. The high density, surface emitting, semiconductor laser array of claim 21 further comprising
a refractive semiconductor layer deposited on said substrate, said first DBR deposited on said refractive layer, said at least one trough formed in said substrate exposing a surface of said refractive layer, and said light emission from one of said optical cavities passes through the surface of said refractive layer in said trough in said substrate.

26. The high density, surface emitting, semiconductor laser array of claim 21 further comprising
a first semiconductor confinement layer deposited on said first DBR,
said active layer deposited on said first semiconductor confinement layer,
a second semiconductor confinement layer deposited on said active layer, and
said second DBR deposited on said second semiconductor confinement layer, wherein said first and second confinement layer have bandgaps intermediate between the bandgaps of said active layer and said first and second DBRs.

27. The high density, surface emitting, semiconductor laser array of claim 21 further comprising
fresnel lenses etched over said optical cavities on said exposed surface of said first DBR in said trough in said substrate.

28. The high density, surface emitting, semiconductor laser array of claim 21 further comprising
a micro lens array positioned over said optical cavities on said exposed surface of said first DBR in said trough in said substrate.

29. The high density, surface emitting, semiconductor laser array of claim 21 wherein said optical cavities form a two-dimensional array.

30. A high density, surface emitting, semiconductor laser array comprising:
a first semiconductor confinement layer deposited on a substrate, said first confinement layer and said substrate having the same conductivity type,
an active semiconductor layer deposited on a said first confinement layer, said active layer providing lightwave generation and propagation under lasing conditions, said active layer having a smaller bandgap than said first confinement layer,
alternating semiconductor layer deposited on said active layer, said alternating layers forming a distributed Bragg reflector (DBR), said DBR having a conductivity type opposite that of said first confinement layer and said substrate,
a semiconductor contact layer deposited on said DBR, said contact layer and said DBR having the same conductivity type,
disordered regions extending through said contact layer, said DBR, said active layer and at least partially through said first confinement layer, said disordered regions having a conductivity type opposite that of said contact layer and said DBR,
at least one trough formed in said substrate exposing a surface of said first confinement layer,
a high reflectivity coating deposited on said exposed surface of said first confinement layer in said trough in said substrate,
at least one contact formed on said substrate, said at least one contact not formed in said trough, and
optical cavities formed between said disordered regions, contacts formed on said contact layer, one of said contacts formed on said contact layer aligned with each of said optical cavities such that current injected between one of said contacts on said contact layer and said at least one contact on said substrate will cause light emission from one of said optical cavities through the exposed surface of said first confinement layer in said trough in said substrate.

31. The high density, surface emitting, semiconductor laser array of claim 30 wherein said substrate, said first confinement layer and said disordered regions have n-type conductivity and said DBR and said contact layer have p-type conductivity.

32. The high density, surface emitting, semiconductor laser array of claim 30 wherein said optical cavities comprises the nondisordered portions of the DBR, the nondisordered portions of the active layer and the nondisordered portions of the first confinement layer between adjacent said disordered regions.

33. The high density, surface emitting, semiconductor laser array of claim 30 wherein an electrically insulating region is formed on each of said disordered regions.

34. The high density, surface emitting, semiconductor laser array of claim 30 further comprising
a refractive layer deposited on said high reflectivity coating,
and said light emission from one of said optical cavities passes through the surface of said refractive layer in said trough in said substrate.

35. The high density, surface emitting, semiconductor laser array of claim 30 further comprising
a second semiconductor confinement layer deposited on said first confinement layer which was deposited on said substrate,
said active layer deposited on said second semiconductor confinement layer,
a third semiconductor confinement layer deposited on said active layer, and
said DBR deposited on said third semiconductor confinement layer, wherein said second and third confinement layers have bandgaps intermediate between the bandgaps of said active layer, and first confinement layer and said DBR.

36. The high density, surface emitting, semiconductor laser array of claim 30 further comprising
fresnel lenses etched over said optical cavities on said exposed surface of said first confinement layer in said trough in said substrate.

37. The high density, surface emitting, semiconductor laser array of claim 30 further comprising
a micro lens array positioned over said optical cavities on said exposed surface of said first confinement layer in said trough in said substrate.

38. the high density, surface emitting, semiconductor laser array of claim 30 wherein said optical cavities form a two-dimensional array.

* * * * *